United States Patent [19]

Delfs et al.

[11] Patent Number: 4,789,823
[45] Date of Patent: Dec. 6, 1988

[54] POWER SENSOR FOR RF POWER MEASUREMENTS

[75] Inventors: Hans Delfs, Ottobrunn; Tilman Betz, Gröbenzell, both of Fed. Rep. of Germany

[73] Assignee: Rohde & Schwarz GmbH & Co. KG, Fed. Rep. of Germany

[21] Appl. No.: 159,520

[22] Filed: Feb. 19, 1988

Related U.S. Application Data

[63] Continuation of Ser. No. 923,438, Oct. 27, 1986.

[30] Foreign Application Priority Data

Nov. 11, 1985 [DE] Fed. Rep. of Germany ....... 3539402

[51] Int. Cl.$^4$ ................ G01R 21/02; G01R 21/00
[52] U.S. Cl. ................................ 324/95; 324/106; 357/28
[58] Field of Search ............... 307/310; 324/95, 106; 329/202, 205 R; 338/13, 15, 20, 23; 357/29, 28, 80, 81, 55; 374/183, 185; 455/33

[56] References Cited

U.S. PATENT DOCUMENTS

| | | | |
|---|---|---|---|
| 3,801,949 | 4/1974 | Larrabee | 357/28 |
| 3,881,181 | 4/1975 | Khajezadeh | 357/81 |
| 3,986,196 | 10/1976 | Decker et al. | 357/55 |
| 4,044,371 | 8/1977 | Abdelrahman et al. | 357/28 |
| 4,072,982 | 2/1978 | Stein | 357/55 |
| 4,152,718 | 5/1979 | Cachier | 357/81 |
| 4,229,753 | 10/1980 | Bergeron et al. | 357/28 |

FOREIGN PATENT DOCUMENTS

| | | |
|---|---|---|
| 3428077 | 5/1985 | Fed. Rep. of Germany . |
| 3428077 | 5/1985 | Fed. Rep. of Germany . |
| 0716006 | 2/1980 | U.S.S.R. ............... 324/106 |

OTHER PUBLICATIONS

"High Sensitivity Miniature-Sized Microwave-Power Monitor", by Yoko et al., Elect. Letters, 2/76, vol. 12, #3, cl. 324–106; pp. 67–68.

"Temperature Range of Silicon Sensors Tops 350° C. mark", by Gosch, Electronics, 5/5/82, vol. 55, #9, pp. 73–74, cl. 357-28.

"A Thin-Film/Semi-conductor Thermocouple for Microwave Power Measurements", by Jackson, HP Journal, 9/74, pp.16–18.

Primary Examiner—Reinhard J. Eisenzopf
Assistant Examiner—W. Burns
Attorney, Agent, or Firm—Hill, Van Santen, Steadman & Simpson

[57] ABSTRACT

In a power sensor for RF power measurments, comprising a thin-film absorbing resistor formed on the top surface of a support member and a thermocouple which is electrically isolated from the circuit of said absorbing resistor, the absorbing resistor is formed on an insulating film of a silicon support member so as to increase the sensitivity and to facilitate manufacture thereof, the silicon support member including an island formed beneath the absorbing resistor, a thermally conducting portion formed in spaced relationship thereto with a narrow bridge portion provided inbetween, and said thermocouple being constituted by the bridge portion and by mutually spaced contact zones formed thereon.

6 Claims, 1 Drawing Sheet

POWER SENSOR FOR RF POWER MEASUREMENTS

This is a continuation of application Ser. No. 923,438, filed Oct. 27, 1986.

The invention concerns a power sensor for RF power measurements.

DESCRIPTION OF THE PRIOR ART

A so-called indirectly heated microwave power sensor including electrically isolated circuits for the radio frequency to be measured and the d.c. current of the thermocouple is known (DE-OS 3,428,077). In this case the power absorbing resistor with its contact points is deposited in thin-film technique on the top surface of a support member of electrically insulating material, and the thermocouple is provided on the back surface of said support member in the form of two separate leads of different materials such that the hot junction of the thermocouple is beneath the power absorbing resistor while the cold junction of the thermocouple is beneath a small pad made from a good thermal conductor provided on the top surface. The thin-film thermocouple, which in this case is vapour-deposited onto the back of the insulating support member, has relatively poor stability, because the volume of the thin films of the thermocouple is very small. Moreover, the separate provision of thin-film circuits on the top and the bottom surface of a support member is relatively expensive.

So-called directly heated power sensors are also known per se (HP Journal September 1974, pp. 16–18), in which the absorbing resistor is formed by thin-film technique on the insulating film of a silicon support member and in which the associated thermocouple is formed by a portion of the silicon support member. But known sensors of this type have the drawback that due to the conductive coupling between the RF measuring circuit and the thermocouple measuring circuit they are unsuitable for low frequencies or even d.c. voltage. Moreover, they cannot be d.c. calibrated in a simple way. Since with these known sensors the RF current is supplied to the absorbing resistor via the silicon and the cross-section of this silicon lead cannot be selected as large as desired on account of the excessive heat dissipation, a very heavily doped silicon must be used with these known sensors, which in turn results in the drawback that the thermoelectric power capable of being produced in the thermocouple is relatively low, i.e. that the thermocouple has a relatively poor sensitivity. Furthermore, a comparatively elaborate web structure for the silicon must be chosen with these known sensors.

SUMMARY OF THE INVENTION

It is the object of the invention to provide a directly heated power sensor of the above-specified kind of simple structure which is readily manufactured and which, while being highly sensitive, has very stable measuring characteristics.

A power sensor according to the invention is equally suitable for measuring d.c. current up to the microwave range of e.g. 18 GHz, and it may readily be d.c. calibrated. Since the thermocouple is formed by the relatively large-volume bridge portion of silicon material, the measuring characteristics of the sensor are very stable with time and the sensor is free from drift. Since, moreover, RF circuit and thermocouple circuit are electrically isolated from each other, the silicon material can be selected solely with a view to the desired characteristics of the thermocouple. It is preferred to use an n-type silicon material, which has a higher thermoelectric power than a p-type silicon material. The silicon material is relatively slightly doped, doping should be less than $5 \times 10^{14}/cm^3$, and it is preferred to select a material with a doping level between $10^{13}$ and $5 \times 10^{14}/cm^3$. Phosphorus is an example of a suitable impurity. The formation of the thermocouple in the narrow bridge portion of the silicon material has the effect that the greatest temperature difference is concentrated in this narrow silicon bridge portion. It is thereby possible merely by correspondingly dimensioning the length and width of said bridge portion to adjust different measurement ranges. If said bridge portion is relatively wide, the sensor will be correspondingly less sensitive but will be capable of temporarily withstanding higher power levels without the risk of a change of material in the absorbing resistor. If, on the other hand, the bridge portion is made very narrow, the sensitivity of the sensor will be correspondingly higher, but the sensor will again be more susceptible to destruction due to excessive heating. In practical use, it is possible to select the respective suitable bridge shape in accordance with the required measuring objective. If it is desired, for instance, that a sensor has a sensitivity in the $\mu$W-range and that the sensor is not permanently altered by RF power temporarily reaching the order of 1 W, it may be suitable to dimension the silicon bridge portion such that its thermal resistance is not more than a few 100° K per watt.

BRIEF DESCRIPTION OF THE DRAWING

Below, an embodiment of the invention will be explained in detail with reference to schematic drawings, in which.

DESCRIPTION OF THE PREFERRED EMBODIMENTS

The illustrated sensor is built up as follows: Initially, a relatively slightly doped small silicon chip 1, for instance n-type $10^{14}/cm^3$, is provided on the top surface with an insulating film 2 e.g. by oxidation of the silicon or by application of an impurity oxide or silicon nitride. The insulating film is very thin such as, for instance, 1 $\mu$m. From said insulating film two small windows 6, 8 are formed in spaced relationship along the centre line (sectional line II—II) by means of etching, and by diffusion or implantation a relatively heavily doped (e.g. $10^{19}/cm^3$) zone 7, 9 is respectively formed beneath said windows 6, 8. Then, a suitable contact material is vapour-deposited and etched at these locations, so that good contact with the silicon material provided therebeneath is obtained in the vicinity of said windows 6, 8.

Figure 1:
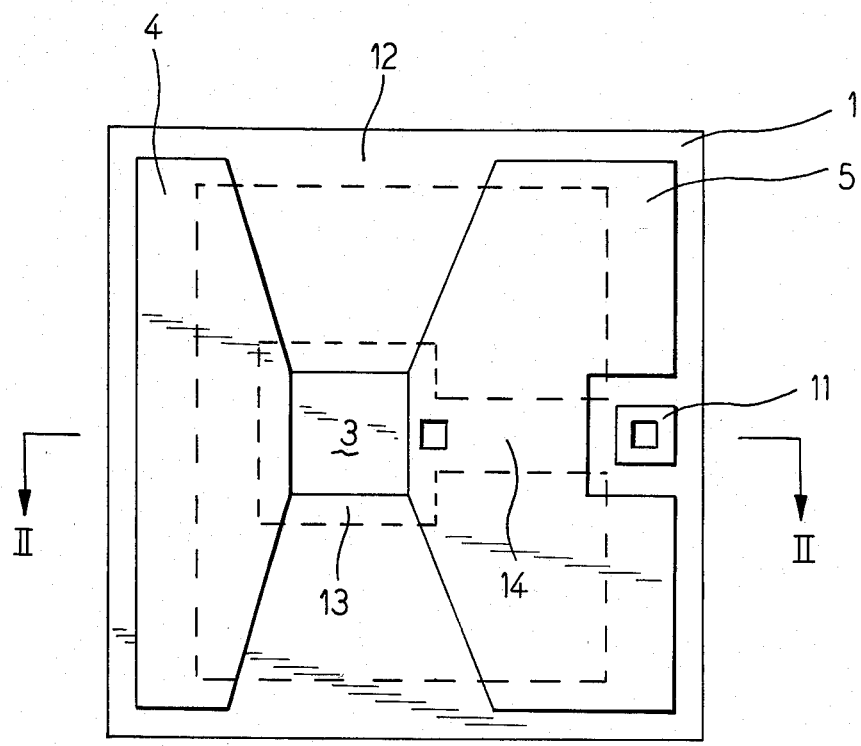
FIG. 1 is a very large-scale plan view showing a sensor according to the invention.
Figure 2:
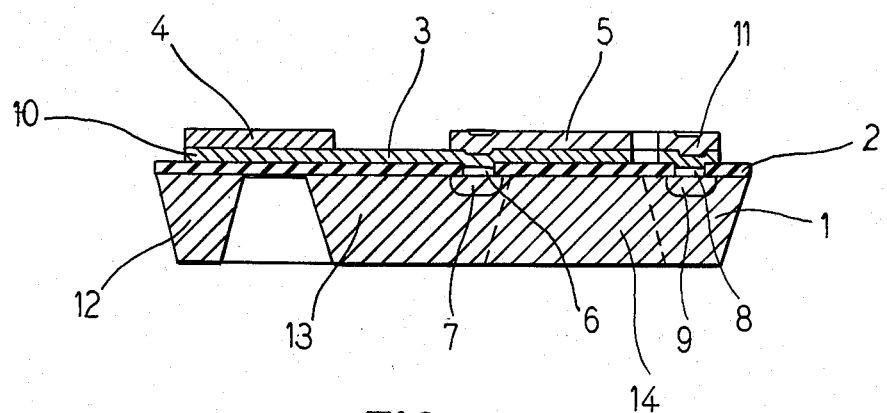
FIG. 2 is a section along the line II—II.

On the thus prepared structure a film 10 of a suitable resistance material, for instance tantalum nitride or nickel-chromium, is vapour-deposited, and a further thin gold film is vapour-deposited thereon. From these two films an approximately rectangular, small absorbing resistor 3 with associated relatively large-area terminal portions 4 and 5 is etched by known thin-film technique in the form shown in FIG. 1, and preferably the absorbing resistor 3 is then trimmed to exactly 50 ohms by means of a laser. In the region of the contact zone 8, 9 the wide terminal portion 5 is recessed and a separate contact zone 11 is etched from the gold film, which is conductively connected only to the silicon zone 9 disposed therebeneath. The silicon zone 7 is conductively connected via the window 6 to the terminal portion 5 etched out thereabove.

Following the above-described preparation of the top surface, the silicon support member 1 is etched on the back thereof such that there merely remains a small island 13 which is provided directly beneath the absorbing resistor 3 and the shape of which approximately corresponds to the shape of said resistor 3 on the top surface. Furthermore, a continuous rim 12 is provided which serves as heat sink portion and as a mechanical support frame and which is connected to the island 13 by means of a narrow land beneath the two windows 6, 7. The remaining silicon material is removed by etching right to the insulating film 2. Subsequently, the top surface may be passivated with a suitable protective film. The frame 12, which functions as heat sink portion, is preferably also bonded to a ceramic substrate in good thermal contact therewith, for instance by a plurality of metallic pads which are distributed across the wide terminal portions 4, 5 and through which the electrical connection to corresponding terminal lugs on said ceramic substrate is simultaneously made. It is a further possibility to widen the terminal portions 4, 5, 11 laterally over the rim of the silicon support member and thereby to provide a good thermally conductive connection to corresponding contacts on a ceramic substrate.

In operation, the RF source whose power is to be measured is connected to the terminal portions 4 and 5, the terminal portion 5 being, for instance, connected to ground. The RF power thus supplied to the small absorbing resistor 3, which for instance has a size of but a few tenths of a millimetre, will heat the resistor whereby the silicon island 13 is simultaneously heated through the thin insulating film 2. The lateral thermal conduction in the insulating film 2 is very small, the terminal portions 4 and 5 are sufficiently thin so that they do not cause any significant thermal conduction. Therefore, the heat produced in the silicon island 13 is substantially dissipated only via the narrow silicon bridge portion 14 to the silicon frame 12, whence it is discharged to the ceramic substrate. Therefore the greatest heat difference occurs at the ends of the silicon bridge portion 14, and proper dimensioning of the silicon structure makes it possible that practically 80% of the temperatre difference will occur in said bridge portion 14. In the silicon bridge portion 14, which acts as thermocouple, this temperature difference causes a relatively high thermal e.m.f. of e.g. 800 to 900 $\mu V/^\circ K$ between the contact zones 6, 7 and 8, 9, which is supplied via the terminal portions 5 and 11 to the amplifier of an indicator means where it is indicated or otherwise utilized. The generated thermal e.m.f. is approximately proportional to the heating of the resistor 3 and thus to the RF power input. Preferably, the two contact zones 6, 7 and 8, 9 are positioned with a maximum spacing therebetween, the one contact zone 6, 7 being formed close to the edge of the absorbing resistor 3 while the other contact zone 8, 9 is approximately formed in the area between the bridge portion 14 and the frame 12 of silicon material. Width and length of the narrow silicon bridge portion are selected in accordance with the desired sensitivity characteristics of the thermocouple. Since the RF circuit 4, 3, 5 is completely electrically isolated from the measuring circuit 11, 8, 9, 1, 7, 6, 5 of the thermocouple and since these two circuits are coupled only at the mass point 5, it is also possible to calibrate the sensor with d.c. voltage in a simple way. The ohmic contact zones 7, 9 are formed by known heavier doping of the silicon material, the doping concentration being selected to be more than $5 \times 10^{18}/cm^3$, preferably within a range between $5 \times 10^{18}/cm^3$ and $5 \times 10^{19}/cm^3$.

What is claimed is:

1. A power sensor for RF-power measurements comprising:
    a silicon support member,
    an insulating film formed on a surface portion of said support member,
    a power absorbing resistor formed over said insulating film,
    an island portion formed beneath said power absorbing resistor,
    a heat sink portion in spaced relation to said island,
    a narrow bridge portion between said island and said heat sink portion, said island portion, heat sink portion and bridge portion all being integral with said silicon support member,
    a thermocouple electrically isolated from said resistor,
    said thermocouple being formed by said bridge portion, and contact zones on said bridge portion electrically connected to said thermocouple in spaced relation.

2. A power sensor according to claim 1 wherein said contact means includes windows in said insulating film above said bridge portion and relatively heavily doped zones in said bridge portion, and
    terminal portions on the top surface of said insulating film electrically connected to said relatively heavily doped zones.

3. A power sensor according to claim 1 wherein said heat sink portion comprises a frame surrounding said island and having a junction with said bridge portion.

4. A power sensor according to claim 3 wherein one of said contact means of said thermocouple is formed on an edge of said island and the other is located at the junction between said bridge portion and said frame.

5. A power sensor according to claim 3 wherein said heat sink frame portion is bonded to a ceramic substrate.

6. A power sensor according to claim 1 wherein said silicon support member consists of n-type silicon with a doping concentration of less than $5 \times 10^{14}/cm^3$.

* * * * *